United States Patent [19]
Hama et al.

[11] Patent Number: 5,754,057
[45] Date of Patent: May 19, 1998

[54] CONTACT MECHANISM FOR TEST HEAD OF SEMICONDUCTOR TEST SYSTEM

[75] Inventors: Hiroyuki Hama, Meiwa-mura; Kazunari Suga, Gyoda, both of Japan

[73] Assignee: Advantest Corp., Tokyo, Japan

[21] Appl. No.: 590,590

[22] Filed: Jan. 24, 1996

[30] Foreign Application Priority Data

Jan. 24, 1995 [JP] Japan .................. 7-027447

[51] Int. Cl.$^6$ .................. G01R 31/02
[52] U.S. Cl. .................. 324/754; 324/758
[58] Field of Search .................. 324/754, 762, 324/758, 761

[56] References Cited

U.S. PATENT DOCUMENTS

| | | | |
|---|---|---|---|
| 4,488,111 | 12/1984 | Widdowson | 324/762 |
| 5,172,053 | 12/1992 | Itoyama | 324/758 |
| 5,321,453 | 6/1994 | Mori et al. | 324/754 |
| 5,489,853 | 2/1996 | Nakajima | 324/754 |
| 5,521,522 | 5/1996 | Abe et al. | 324/758 |
| 5,656,943 | 8/1997 | Montoya et al. | 324/754 |

*Primary Examiner*—Vinh P. Nguyen
*Assistant Examiner*—Russell M. Kobert
*Attorney, Agent, or Firm*—Muramatsu & Associates

[57] ABSTRACT

A contact mechanism is for a test head of a semiconductor test system for connecting the test head to a wafer prober or a test handler having a semiconductor device to be tested. The contact mechanism includes, a performance board mounted between the test head the wafer prober wherein the performance board has a guide hole, an insert ring mounted on a frame of the wafer prober, a probe card mounted on a central portion of the insert ring for contacting the semiconductor device to be tested, a contactor having a plurality of contact pins to achieve electric contact between the performance board and the probe card when pressed in downward by the performance board, a performance board shaft extending from a bottom of the test head and penetrating the guide hole of the performance board, a shaft clamp provided on the insert ring having a shaft guide hole to receive the performance board shaft therethrough wherein a bottom of the shaft guide hole is lower than a surface of the insert ring. In another aspect, the contact mechanism further includes a test head elevator to assist the vertical movement of the test head by reducing the weight of the test head.

6 Claims, 5 Drawing Sheets

CONTACT MECHANISM FOR TEST HEAD OF SEMICONDUCTOR TEST SYSTEM

FIELD OF INVENTION

The present invention relates to a contact mechanism for connecting a test head of a semiconductor test system with a wafer prober or an automatic test handler, and more particularly, to a contact mechanism which is capable of minimizing a distance between a performance board of the test head and a device under test mounted on the wafer prober or the automatic test handler as well as improving the positioning precision and the connection/disconnection operation.

BACKGROUND OF THE INVENTION

A semiconductor test system has a test head which is provided in a separate housing and electrically connected to the semiconductor test system through a bundle of cables. Semiconductor devices to be tested (DUT), such as a packaged semiconductor IC or a semiconductor wafer are provided to the test head by, for example, an automatic test handler or a wafer prober. On the test head, the DUTs are provided with test signals generated by the semiconductor test system and the resulted output signals from the DUTs are compared with expected data and transmitted to the semiconductor test system for an evaluation purpose.

When performing a semiconductor test, the test head of the semiconductor test system and a test handler or a wafer prober are connected with each other. Here, a wafer prober is an automatic device for continuously providing semiconductor wafers to be tested to the appropriate position of the test head. A test handler is an automatic device for continuously providing packaged semiconductor devices to be tested, typically packaged ICs, to the appropriate position of the test head.

In this arrangement, the DUTs (ICs or semiconductor wafers) positioned by the wafer prober or test handler can receive test signals from the test head of the semiconductor test system and resulted signals from the DUTs pass through the test head and flow through the cables to the semiconductor test system.

The test head is provide with a performance board which has a mechanism for contacting the DUTs and is directly coupled with the test handler or the wafer prober. Because the size, the number of pins and many other factors are different between the kinds of DUTs, various kinds of performance boards are prepared for corresponding kinds of DUTs. When testing a different kind of DUTs, the test head is disconnected from the test handler or the wafer prober to replace the performance board. After installing a new performance board, the test handler or the wafer prober is connected to the test head to start the test for the new kind of DUTs.

Since a recent semiconductor device has a large number of input and output pins, for example several hundred pins, the test head to supply and receive various kinds of signals to and from the semiconductor device has a considerably large and heavy structure. For example, a typical test head weighs around 200 kg which requires several persons to work together to connect or disconnect the test head with the test handler or the wafer prober.

Further, for testing a recent ultra-high speed semiconductor device, is provided with circuit components which have been conventionally included in a main frame of the semiconductor system tend to be provide in the test head in the vicinity of the DUT in order to prevent the jitter, noise or signal deformation. Therefore, the test head of the semiconductor test system tends to become heavier.

Figure 5:
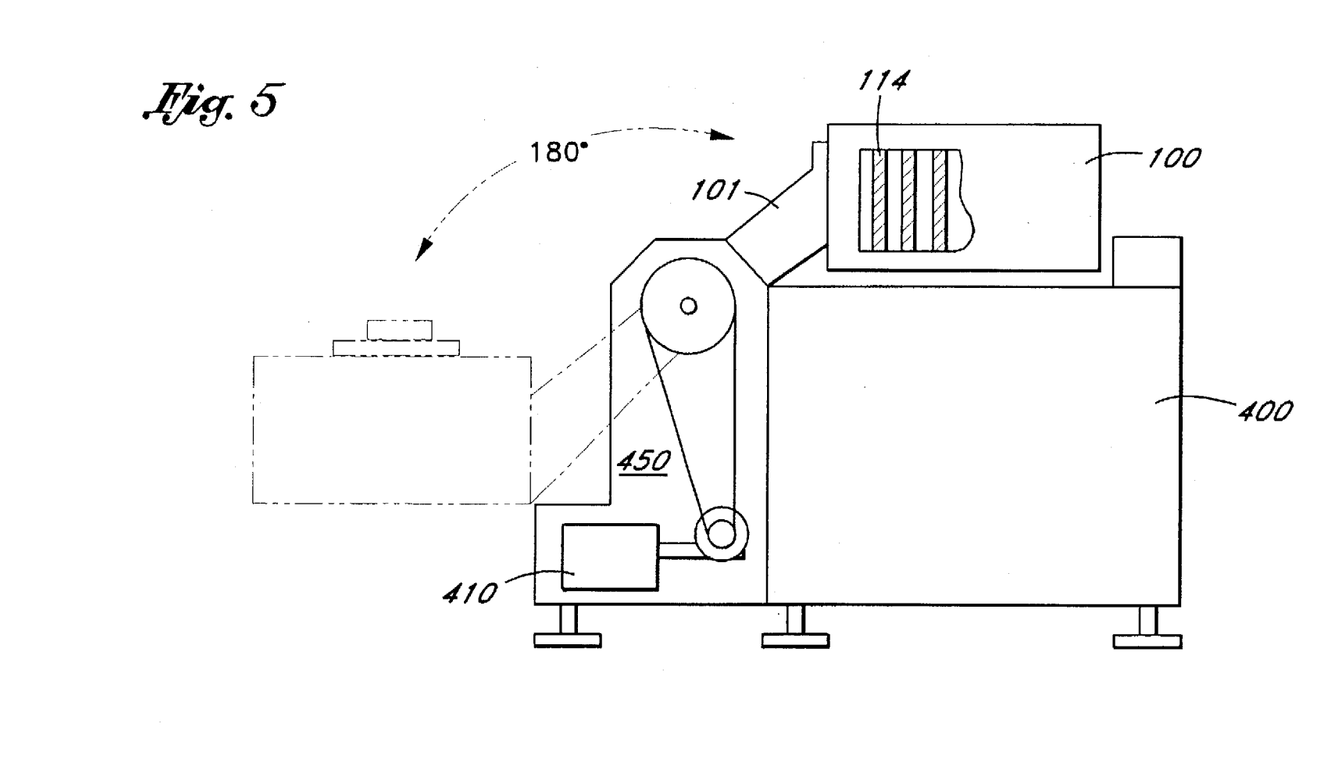
FIG. 5 is a schematic showing an overall structure of the conventional contact mechanism where the test head and wafer prober are connected by the assistance of a test head rotation device.

FIG. 5 shows an example of conventional method for connecting or disconnecting the test head with the wafer prober by using a test head rotation device. Since a test head is a heavy device of 200 kg or more, the test head 100 is connected or disconnected from the wafer prober 400 by means of a test head rotation device 450. In the example of FIG. 5, the test head rotation device 450 is connected to the housing of the wafer prober 400.

When testing a semiconductor wafer, the test head 100 is loaded on a test head arm 101 of the test head rotation device 450. Then, the test head 100 is rotated for 180 degree so that the test head 100 is positioned over the wafer prober 400 and connected therewith. The test head arm 101 is rotated by a motor 410 which is provided in the rotation device 450. Then, the test head 100 is positioned over the wafer prober 400, wherein the connect/disconnect operation of the test head 100 with the wafer prober 400 is performed.

When the DUT is replaced with another type of DUT, a performance board 130 (shown in FIG. 4) mounted on the test head 100 needs to be replaced. The replacement of the performance board 130 requires the test head 100 be disconnected from the wafer prober 400. Another situation where requires the disconnection of the test head 100 arises when a self diagnosis test is performed for the semiconductor test system. Furthermore, the test head 100 needs to be disconnected from the wafer prober 400 when built-in pin cards 114 (FIG. 4) in the test head 100 need to be replaced for the purpose of maintenance and repair.

The conventional system requires a relatively large space for the test head 100 placed at the side of the wafer prober as shown in the dotted line of FIG. 5. Further, when the test head moves from the wafer prober to the side of the wafer prober 400 by the 180 degree rotation of the test head rotation device 450, the test head 100 comes higher position than an operator's head. This operation in the convention system is dangerous for the operator since the test head is very heavy.

Figure 4:
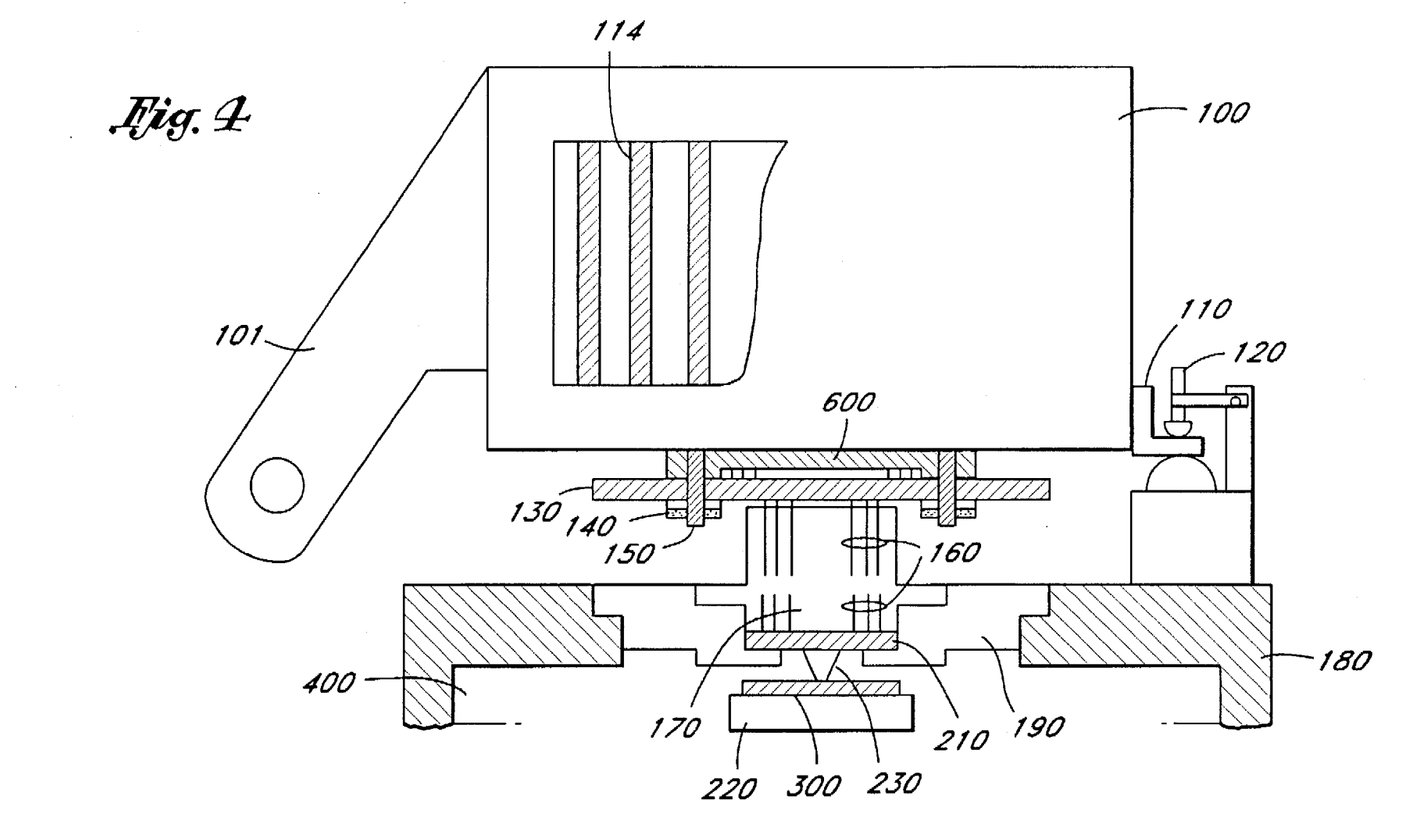
FIG. 4 is a cut-away front view of the conventional contact mechanism showing the connected state of the test head and wafer prober.

FIG. 4 is a cut-away front view showing a more detailed structure of the conventional contact mechanism for connecting the test head and wafer prober. The test head 100 is rotatably placed on the wafer prober 400 with respect to a rotary shaft of the test head rotation device 450. A stopper 110 is provided on the housing of the test head 100 to be fixed on a head plate 180 which is a frame of the wafer prober by a clamp 120.

At the top of the wafer prober 400, an insert ring 190 is provided on the head plate 180. At the bottom of the insert ring 190, a probe card 210 is provided which has needles 230 to contact the surface of a semiconductor wafer 300 that is to be tested. The semiconductor wafer 300 is accurately positioned on the wafer prober 400 by a chuck 220 so that the needles 230 contact a desired position on the semiconductor wafer 300.

A frog ring 170 is attached to the insert ring 190 to establish an electrical contact between the performance board 130 and the probe card 210. The frog ring 170 includes a plurality of contact pins 160 in a ring like manner both in the upper and lower layers. The corresponding pair of the contact pins in the upper and lower layers are connected by a wire for example within the frog ring 170.

The contact pins 160 of the frog ring 170 are comprised of an elastic mechanism to establish electrical contact between the performance board 130 and the probe card 210 when pressed in the vertical direction. Each of the surface of the performance board 130 and the probe card 210 has a plurality of electrodes in a ring like manner to meet the corresponding contact pins 160 of the frog ring 170.

The performance board 130 is mounted in the following manner. The performance board 130 is provided underneath a signal contact ring 600 which is attached to the bottom of the test head 100. The performance board 130 is fixed by performance board shafts 150 extending from the test head 100 which are fastened by performance board lock rings 140. Namely, the signal contact ring 600 and performance board 130 are bound together by the performance board shafts 150 penetrating the performance board 130 and fixed on the test head 100. The signal contact ring 600 transmits signals between the pin cards 114 in the test head 100 and the performance board 130, wherein contact pins are provided for the electric contact between them.

When the test head 100 is positioned over the wafer prober 400, the stopper 110 provided on the housing of the test head 100 is fixed on the head plate 180 by the clamp 120. Thus, the test head 100 is coupled with the wafer prober 400. By the weight of the test head 100, the contact pins 160 of the frog ring 170 are pressed downward by the performance board 130 with the predetermined stroke, which results an electric contact between the contact pins 160 in the upper layer of the frog ring 170 and the electrodes of the performance board 130.

At the same time, the contact pins 160 in the lower layer of the frog ring 170 are also pressed downward to establish an electric contact between the contact pins 160 and the electrodes on the surface of the probe card 210. Since the corresponding contact pins 160 between the upper and lower layers are electrically connected by wires, for example, the electrical contact is established between the performance board 130 and the probe card 210.

When the test head 100 is coupled with the wafer prober 400 in the manner as noted above, a large downward force, 120 Kg for instance, is applied to the wafer prober through the frog ring 170. The positioning of the test head 100 relative to the wafer prober 400 is determined by adjusting the movement of a rotary shaft of the test head arm 101, which is another fulcrum, and the test head 100.

For replacing the performance board 130, the test head 100 has to be separated from the wafer prober 400. Then the performance board lock ring 140 of the test head 100 is removed from the performance board shafts 150 to free the performance board 130. Further, in case where the pin card 114 in the test head 100 has to be replaced for repair and maintenance, the performance board 130 has also to be removed in the manner noted above.

As described above, in the conventional system, the performance board shafts 150 projected from the test head 100 should not contact the insert ring 190 of the wafer prober 400. As a consequence, it is required that a certain distance has to be kept between the end of the performance board shaft 150 and the insert ring 190. Therefore, it is difficult to further shorten the signal transmission length between the performance board 130 and the probe card 210. For testing a high speed semiconductor device, the shorter electric distance is needed to avoid the noises, cross talks and any deterioration of signal forms.

Moreover, a tip of the needle 230 extended from the probe card 210 contacts the wafer 300 loaded on the chuck 220 which is fixed inside the wafer prober 400. Thus, it requires the precise placement of the needle 230. However, in the conventional structure, the downward force of 120 Kg is applied to the probe contact pins 160 located between the performance board 130 and frog ring 170, it causes distortion between the insert ring 190 and head plate 180. One of the reasons is that the downward force is concentrated on a central portion of the insert ring 190 through the contact pins 160 of the frog ring 170. The distortion adversely affects the positioning accuracy of the needle 230 extended from the probe card 210 relative to the wafer 300.

Therefore, there is a need in the contact mechanism for test head of the semiconductor test system to minimize the distance between the performance board 130 and the probe card 210 or the wafer 300 that is to be tested for testing the high speed semiconductor devices in the wafer.

Also, there is a need in the contact mechanism for the test head to improve the positioning accuracy of the tip of the needle 230 extending from the probe card 210 with respect to the wafer 300 under test by reducing the distortion between the insert ring 190 and head plate 180 when weight of the test head is applied to the probe contact pins 160 provided in the frog ring 170.

As noted above, since the test head weighs as high as 200 Kg, the operations for connecting the test head to the wafer prober or removing the test head from the wafer prober require hard work. Therefore, there is a need in the contact mechanism of the test head to realize an easy operation for connecting or disconnecting the test head with respect to the wafer prober so that the replacement of the performance board 130 can be carried out more efficiently.

The conventional system requires a relatively large space for the test head 100 placed at the side of the wafer prober as shown in the dotted line of FIG. 5. Since the semiconductor test systems are installed in a clean room, the space cost is very high which increases the overall test cost of the semiconductor devices. Further, as noted above, since the test head 100 comes to the position higher than an operator's head during the process of the 180 degree rotation, the conventional system involves serious risks for the operators. Therefore, there is a need in the contact mechanism for the test head to reduce the space and risk involved in the rotation of the test head.

SUMMARY OF THE INVENTION

It is an object of the present invention to provide a contact mechanism for a test head of a semiconductor test system which is capable of improving the high speed test performance by shortening the signal propagation distance between the device under test and the test head.

It is another object of the present invention to provide a contact mechanism for a test head of a semiconductor test system which is capable of improving the positioning precision of the tip of needle to contact the surface of the device under test by reducing the distortion associated with the weight of the test head when the test head is connected to a wafer prober or a test handler.

It is a further object of the present invention to provide a contact mechanism for a test head of a semiconductor test system which is capable of achieving an easier connection and disconnection of the test head, which allows an easy replacement of a performance board or other circuit board of the test head.

It is a further object of the present invention to provide a contact mechanism for a test head of a semiconductor test system which is capable of minimizing a space associated with the operation of the contact mechanism and a risk involved in the operation of connection and disconnection of the test head.

A contact mechanism of the present invention is for a test head of a semiconductor test system for connecting the test head to a wafer prober or a test handler having a semiconductor device to be tested. The contact mechanism includes, a performance board mounted between the test head the wafer prober wherein the performance board has a guide hole, an insert ring mounted on a frame of the wafer prober, a probe card mounted on a central portion of the insert ring for contacting the semiconductor device to be tested, a contactor having a plurality of contact pins to achieve electric contact between the performance board and the probe card when pressed in downward by the performance board, a performance board shaft extending from a bottom of the test head and penetrating the guide hole of the performance board, a shaft clamp provided on the insert ring having a shaft guide hole to receive the performance board shaft therethrough wherein a bottom of the shaft guide hole is lower than a surface of the insert ring.

In another aspect of the present invention, the contact mechanism further includes a test head elevator which is provided to assist the vertical movement of the test head by reducing the weight of the test head.

According to the present invention, since the performance board shafts are engaged with the performance board shaft clamps which are embedded in the insert ring, the performance board can come closer to the probe card of the wafer prober by using a thinner frog ring which provides electrical connection between the performance board and the probe card. As a result, the signal transmission length between the test head and the wafer prober is considerably shortened, allowing the improved measurement accuracy for the high speed device testing.

Due to the engagement between the performance board shafts and performance board shaft clamps provided on the insert ring, the pressure caused by the weight of the test head is acted on the insert ring via the performance board shafts. Since the pressure is not exclusively applied to the narrow center area of the insert ring, in the present invention, the deformation between the insert ring and head plate will be minimized. Therefore, the positioning accuracy of the probe card needle can be dramatically improved.

Since the present invention provides the test head elevator as a part of the contact mechanism which functions to reduce the weight of the test head, the test head is gently engaged with the wafer prober. In addition, since the test head is easily movable in the up-down direction with a small additional force, the connection and disconnection operation between the test head and wafer prober for replacing the performance board becomes easy and safe.

Furthermore, the performance board loading mechanism lifts the performance board upward when the test head is not fully connected to the wafer prober and thus makes the performance board freely moveable in the horizontal direction, which makes the replacement of the performance remarkably efficient.

Moreover, because it is not necessary to rotate the test head by 180 degrees as in the conventional technology, the space for such rotation is no longer necessary in the present invention. Therefore, the space cost for the overall semiconductor test system can be reduced, which improves the overall test efficiency of the semiconductor devices. In addition, since the test head does not have to rotate, the risk for the operator is greatly reduced.

DETAILED DESCRIPTION OF THE PREFERRED EMBODIMENT

Figure 1:
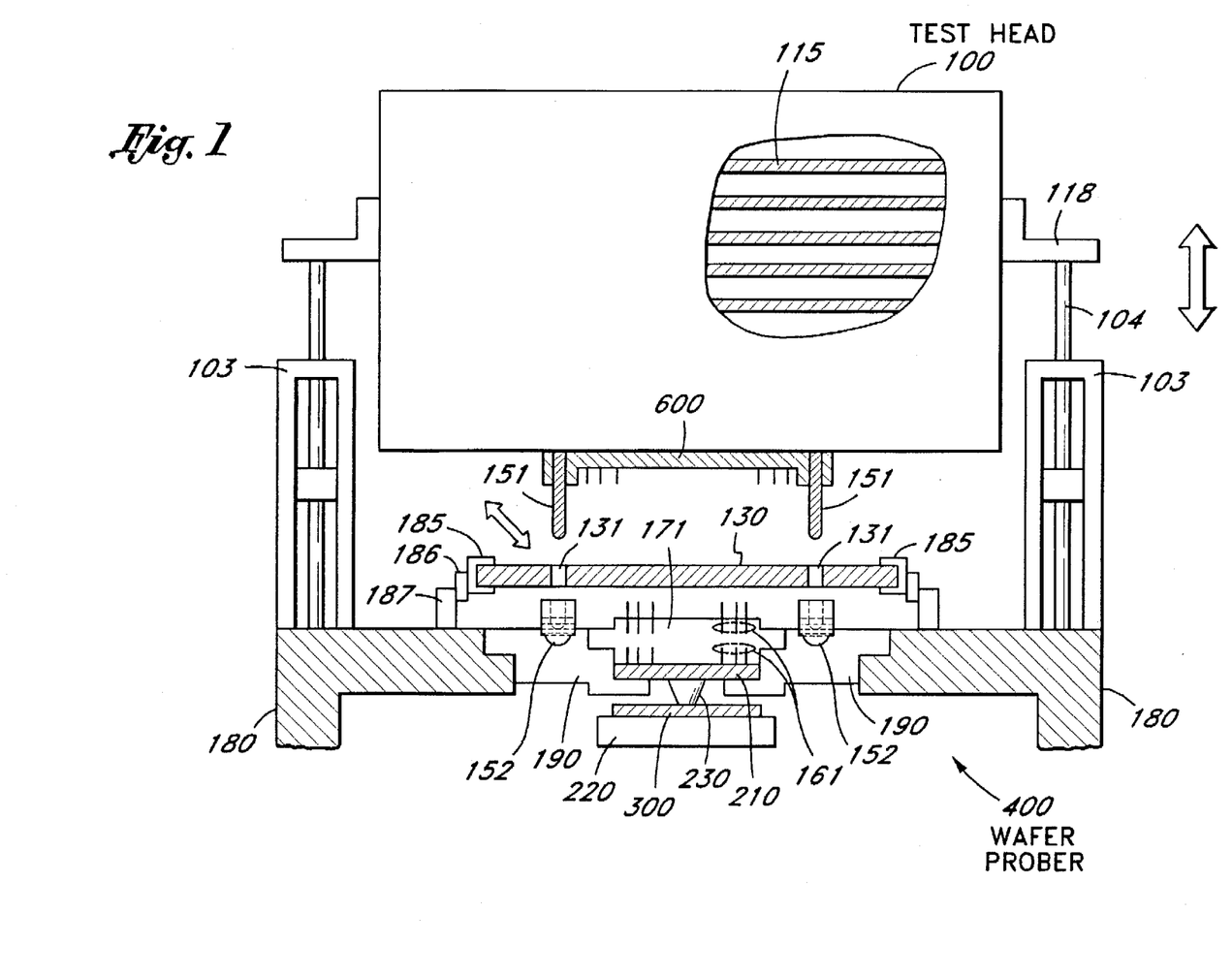
FIG. 1 is a cut-away front view of the contact mechanism of the preferred embodiment of the present invention showing the situation where a test head and a wafer prober are not fully connected.

FIG. 1 is a cut-away view of the preferred embodiment of the present invention showing the connected state of the test head and wafer prober. Although the present invention is explained with respect to the wafer prober, the concept of the present invention is equally applicable to the connection with a test handler.

In FIG. 1, the test head 100 is positioned over the wafer prober 400. A stopper 118 is provided on the housing of the test head 100 which is to contact with an end of an arm 104 of a test head elevator 103. The test head elevator 103 is mounted on a head plate 180 which is a frame of the wafer prober 400.

The test head elevator 103 is to easily move the test head 100 in an up-down direction. The elevator 103 has a cylindrical structure, for example, which is driven by a compressed air force. Other type of elevator can be also possible, such as a one including a motor driven gear. It is also possible to connect a balancing weight by a wire or the like in the opposite side of the test head elevator 103 to balance the weight of the test head 100. More than one test head elevators 103 can be employed in the embodiment of FIG. 1 to support the test head.

At the top of the wafer prober 400, an insert ring 190 is provided on the head plate 180. At the bottom of the insert ring 190, a probe card 210 is provided which has needles 230 to contact the surface of a semiconductor wafer 300 that is to be tested. The semiconductor wafer 300 is accurately positioned on the wafer prober 400 by a chuck 220 so that the needles 230 contact a desired position on the semiconductor wafer 300.

A frog ring 171 is attached to the insert ring 190 to establish an electrical contact between the performance board 130 and the probe card 210. The insert ring 190 is mounted on the head plate 180 to receive the frog ring 171. The insert ring 190 is also to receive the weight of the test head 100 as will be described later. Similar to the example of FIG. 4, the frog ring includes a plurality of contact pins 161 in a ring like manner both in the upper and lower layers of the frog ring 171. As shown in FIG. 1, the frog ring 171 of the present invention is thinner than that of the conventional structure of FIG. 4.

Each of the contact pins 161 is formed of an elastic mechanism to establish electrical contact between the performance board 130 and the probe card 210 when pressed in the up-down direction. Each of the surfaces of the performance board 130 and the probe card 210 has a plurality of electrodes in a ring like manner to meet the corresponding contact pins 161 of the frog ring 171.

In the preferred embodiment, the performance board 130 is mounted in the following manner. The performance board 130 is inserted in a loading mechanism 185 which is provided on the head plate 180 of the wafer prober 400. The loading mechanism 185 has an opening, or a rail mechanism, for receiving the performance board 130 in a manner in which the performance board 130 can be slidably moveable and positioned right over the frog ring 171.

A signal contact ring 600 is attached to the bottom of the test head 100. The signal contact ring 600 transmits signals between the pin cards 114 in the test head 100 and the performance board 130, wherein contact pins are provided for the electric contact between them. Also attached at the bottom of the test head are performance board shafts 151 in a downward direction. The performance board 130 has a plurality of guide holes 131 to allow the performance board shafts 151 to pass therethrough.

At the outside of the frog ring 171, it is provided a plurality of shaft clamps 152 on the insert ring 190 to receive the performance board shafts 151 in the corresponding positions. Namely, each of the shaft clamps 152 is positioned in the same axial position of the performance board shaft 151 and the guide hole 131 on the performance board 130.

Each of the shaft clamps 152 has a guide hole to accurately position the performance board shaft 151 by receiving the shaft 151 therethrough. Further, the substantial portion of the shaft clamp 152 is embedded in the insert ring 190 in such a way that the bottom of the guide hole of the shaft clamp 152 is positioned lower than the upper surface of the insert ring 190 on the head plate 180 of the wafer prober 400.

The load mechanics 185 is preferably connected to a flexible member 186 and a support member 187 as shown in FIG. 1. The flexible member 186 is elastically moveable in the vertical direction while the support member 187 remains unchanged on the head plate 180. When the test head 100 is not connected to the wafer prober 400, the flexible member 186 establishes a sufficient space, 100 mm for example, between the frog ring 171 and the performance board 130 by lifting the performance board 130 upward. Thus, in this situation, the performance board can be slidably moveable in the horizontal direction on the wafer prober 400. Therefore, in this structure of the present invention, the replacement of the performance board 130 becomes remarkably easy.

Figure 2:
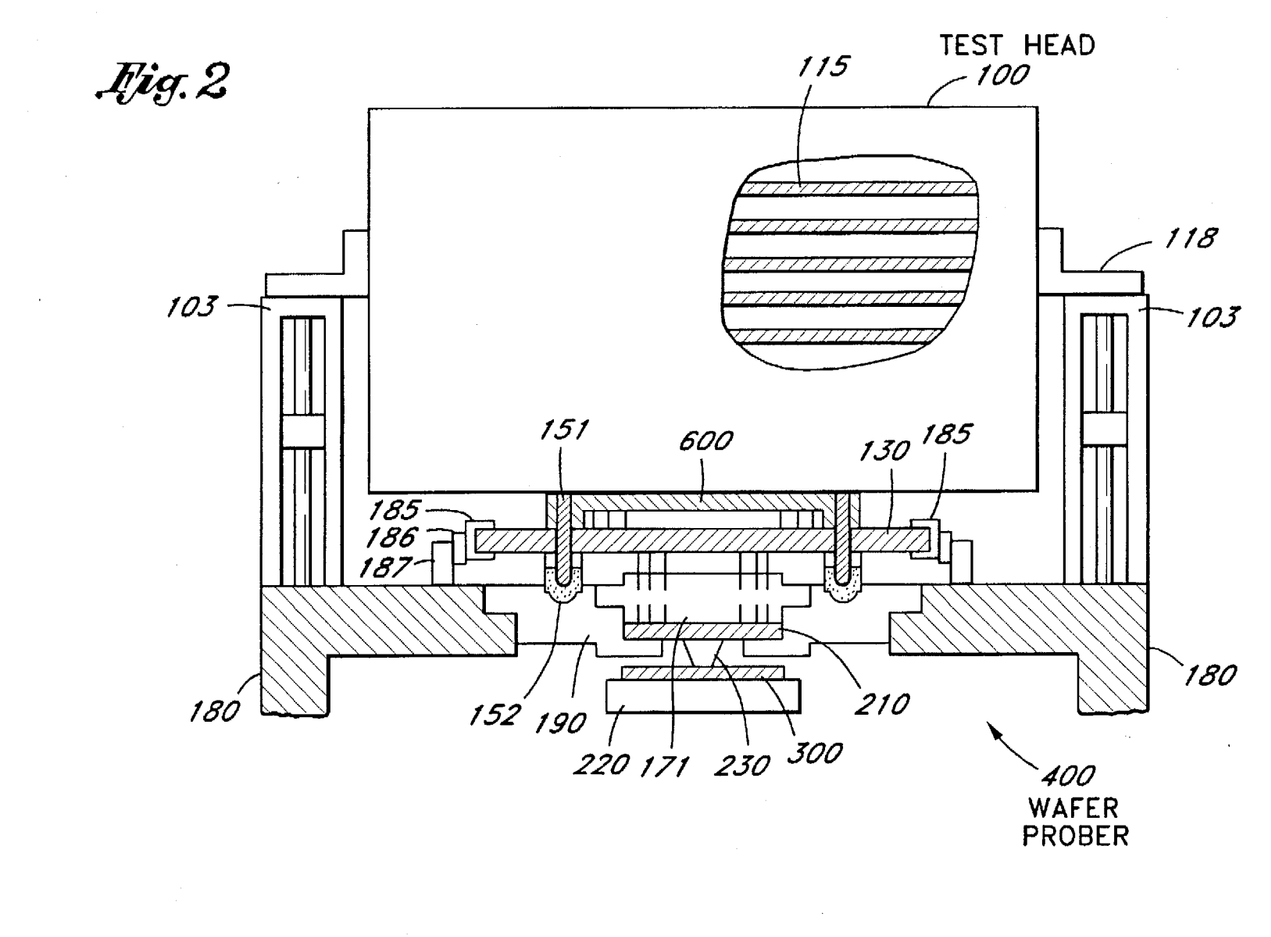
FIG. 2 is a cut-away front view of the contact mechanism of the preferred embodiment of the present invention showing the situation where a test head and a wafer prober are fully connected.

FIG. 2 shows the state where the test head 100 and the wafer prober 400 are connected by the contact mechanism of the present invention. Under the control of the test head elevator 103, the test head 100 moves downward. Because the elevator 103 functions to reduce the weight of the test head 100, the downward force of the test head 100 is considerably smaller than the weight of the test head 100.

Then, the performance board shafts 151 penetrate the guide holes 131 on the performance board 130 and engage with the performance board shaft clamps 152 which are inserted into the insert ring 190. When the ends of the performance board shafts 151 reach the bottom of the guide holes of the shaft clamps 152, the contact pins 161 in the upper and lower layer of the frog ring 171 are appropriately pressed to establish sufficient electrical contact with the performance board 130 and the probe card 210.

In the situation of FIG. 2, since the ends of the performance board shafts 151 can be considerably lower than the surface of the insert ring 190, the distance between the performance board 130 and the probe card 210 can be minimized. Namely, in the present invention, it is not necessary to provide a space between the ensd of the performance board shafts 150 and the surface of the insert ring 190, unlike the conventional structure of FIG. 4 which includes the lock rings 140 to secure the performance board at the end of the performance board shafts 150.

Furthermore, the substantial portion of the weight of the test head 100 is loaded on the insert ring through the shaft clamps 152 which are apart from the center area of the insert ring 190. Thus, unlike the conventional structure of FIG. 4, the weight is not concentrated on the center of the insert ring 190 through the frog ring 171, the distortion of the insert ring 190 is considerably reduced to realize an accurate positioning by the needles 230 on the surface of the wafer 300 to be tested.

In the preferred embodiment of the present invention, as shown in FIG. 1, the multiple pin cards 115 can be installed horizontally rather than vertically from the side of test head 100. This arrangement has an advantage that, when there arises a need to replace one or more pin cards 115 in the test head 100 because of a malfunction or the like, such a replacement can be achieved without removing the performance board 130.

Figure 3:
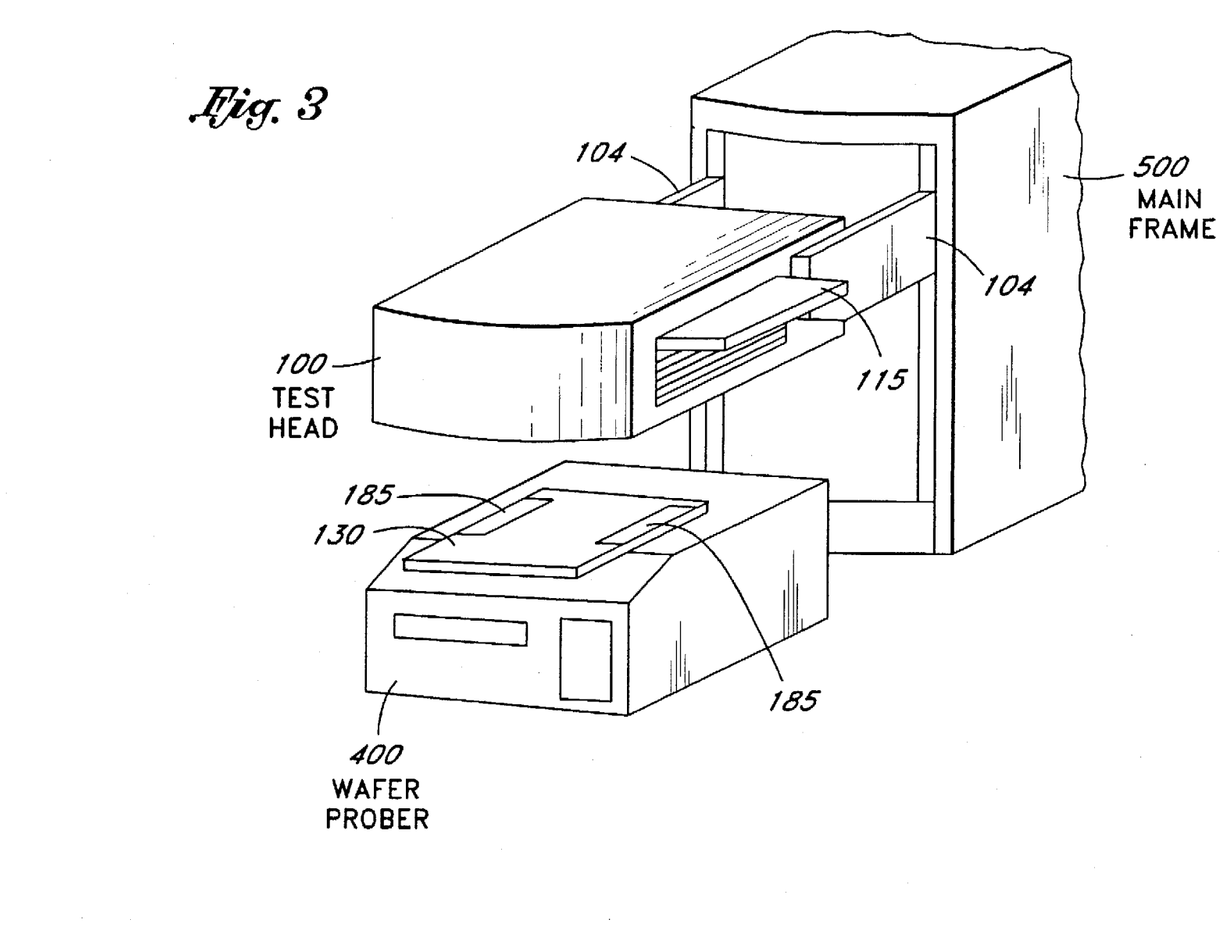
FIG. 3 is a perspective view showing a schematic structure of the main frame and the test head of the semiconductor test system and the wafer prober according to the present invention.

FIG. 3 is a perspective view showing another preferred embodiment with use of the test head and wafer prober and a main frame of the semiconductor test system. In the example of FIG. 3, the test head 100 is supported by the test head arm 104 provided on the main frame 500. The main frame 500 includes an elevator (not shown) or other mechanism to drive the test head arm 104 in the vertical direction. By the movement of the test head arm 104, the test head 100 is arranged to be placed over the wafer prober 400 in the manner described with respect to FIGS. 1 and 2.

The present invention as described in the foregoing provides the following effects.

Since the performance board shafts are engaged with the performance board shaft clamps which are embedded in the insert ring, the performance board can come closer to the probe card of the wafer prober by using a thinner frog ring which provides electrical connection between the performance board and the probe card. As a result, the signal transmission length between the test head and the wafer prober is considerably shortened, allowing the improved measurement accuracy.

Due to the engagement between the performance board shafts and performance board shaft clamps provided on the insert ring, the pressure caused by the weight of the test head is acted on the insert ring via the performance board shafts. Since the pressure is not applied to the narrow center area of the insert ring, in the present invention, the deformation between the insert ring and head plate will be minimized. Therefore, the positioning accuracy of the probe card needle, which has been a problem in the conventional invention, is remarkably improved.

Since the present invention provides the test head elevators as a part of the contact mechanism which functions to reduce the weight of the test head, the test head is gently engaged with the wafer prober. In addition, the test head is easily movable in the up-down direction with a small additional force, the connection and disconnection operation between the test head and wafer prober for replacing the performance board becomes easy and safe.

Furthermore, because of the performance board loading mechanism 185 lifts the performance board 130 upward when the test head is not fully connected to the wafer prober and thus makes the performance board freely moveable in the horizontal direction, the replacement efficiency of the performance boards is remarkably improved.

Moreover, because it is not necessary to rotate the test head by 180 degrees as in the conventional technology, the space for such rotation is no longer necessary in the present invention. Therefore, the space cost for the overall semiconductor test system can be reduced, which improve the overall test efficiency of the semiconductor devices. In addition, since the test head does not have to rotate, the risk for the operator is greatly alleviated.

What is claimed is:

1. A contact mechanism for a test head (100) of a semiconductor test system for connecting the test head (100) to a wafer prober (400) having a semiconductor device (300) to be tested, comprising:
   - a performance board (130) mounted between said test head (100) and said wafer prober (400) and having a guide hole (131);
   - an insert ring (190) mounted on a frame (180) of said wafer prober (400);
   - a probe card (210) mounted on a central portion of said insert ring (190) for contacting said semiconductor device (300) to be tested;
   - a contactor (171) having a plurality of contact pins (161) to achieve electric contact between said performance board (130) and said probe card (210) when pressed downward by said performance board (130);
   - a performance board shaft (151) extending from a bottom surface of said test head (100) and penetrating through said guide hole (131) of said performance board (130); and
   - a shaft clamp (152) provided on said insert ring (190) having a shaft guide hole to receive said performance board shaft (151) therethrough, a bottom of said shaft guide hole is lower than a surface of said insert ring (190).

2. A contact mechanism as defined in claim 1, wherein said contactor (171) for achieving the electric contact between said performance board (130) and said probe card (210) is a frog ring (171).

3. A contact mechanism as defined in claim 1, further comprising:
   - a performance board loading mechanism (185) for lifting said performance board (130) in a vertical direction by means of a spring force, said performance board loading mechanism (185) allowing said performance board (130) to be slidably moveable in a horizontal direction.

4. A contact mechanism as defined in claim 1, further comprising:
   - at least one test head elevator (103) for moving said test head in a vertical direction to reduce a weight of said test head (100).

5. A contact mechanism as defined in claim 4, wherein said test head elevator (103) has a cylindrical structure.

6. A contact mechanism as defined in claim 4, wherein said test head elevator (103) is an arm (104) provided on a main frame (500) of said semiconductor test system.

* * * * *